(12) United States Patent
Theuss

(10) Patent No.: US 7,759,135 B2
(45) Date of Patent: Jul. 20, 2010

(54) METHOD OF FORMING A SENSOR NODE MODULE

(75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/242,163

(22) Filed: Sep. 30, 2008

(65) Prior Publication Data

US 2010/0078832 A1   Apr. 1, 2010

(51) Int. Cl.
  *H01L 21/00* (2006.01)
  *H01L 21/44* (2006.01)
  *H01L 23/58* (2006.01)
  *H01L 27/14* (2006.01)
  *H01L 23/22* (2006.01)

(52) U.S. Cl. .............. 438/5; 438/10; 438/14; 438/126; 438/127; 257/48; 257/414; 257/687; 257/E23.116; 257/E23.123

(58) Field of Classification Search .......... 438/5, 438/7, 10, 11, 14–18, 124, 126, 127; 257/48, 257/414–421, 678, 687, E25.001, E25.004, 257/E25.009, E23.001, E23.116, E23.123, 257/E23.127, E23.128; 73/78, 73, 776, 777, 73/862.333, 862.68; 235/439, 440; 374/45, 374/100, 196, E7.001, E7.009, E7.016
See application file for complete search history.

(56) References Cited

U.S. PATENT DOCUMENTS 6,784,551 B2   8/2004   Auburger et al.
7,056,764 B2   6/2006   Auburger et al.
7,445,959 B2 * 11/2008  Theuss ................ 438/108
7,563,652 B2 * 7/2009   Yang et al. ............ 438/126
2001/0016370 A1 8/2001  Ho
2002/0089053 A1 7/2002  Liu et al.
2003/0052702 A1 3/2003  Auburger et al.
2004/0197953 A1 10/2004 Funk
2008/0009102 A1* 1/2008  Yang et al. ............ 438/126
2008/0036099 A1 2/2008  Theuss et al.
2008/0128838 A1 6/2008  Theuss
2008/0185673 A1 8/2008  Theuss

FOREIGN PATENT DOCUMENTS

DE   29921553 U1   5/2000
DE   20221182 U1   6/2005

OTHER PUBLICATIONS

Theuss et al., "A Leadless Packaging Concept for High Frequency Applications," Electronic Components and Technology Conference, 2004, Publication Date Jun. 2004, vol. 2, pp. 1851-1854. (4 pages).
Wikipedia, The Free Encyclopedia, "Sensor node," website http://en.wikipedia.org/wiki/Sensor_node, last modified Sep. 25, 2008, 4 pages.

* cited by examiner

*Primary Examiner*—Hsien-ming Lee
(74) *Attorney, Agent, or Firm*—Dicke, Billig & Czaja, PLLC

(57) ABSTRACT

A method of manufacturing a sensor node module includes forming a protruding structure on a carrier. A sensor die is applied onto the protruding structure with an active sensing surface of the sensor die facing the carrier. The sensor die is encapsulated with mold material, wherein the protruding structure prevents the mold material from covering the active sensing surface. The carrier and the protruding structure are removed from the sensor die.

20 Claims, 4 Drawing Sheets

METHOD OF FORMING A SENSOR NODE MODULE

BACKGROUND

There is considerable interest in industry in continuously reducing the size of sensors while increasing their sensitivity and intelligence. This has led to the integration of sensors into semiconductor chips. Semiconductor chip based sensors can be miniaturized and integrated with electronic circuits.

SUMMARY

One embodiment provides a method of manufacturing a sensor node module. The method includes forming a protruding structure on a carrier. A sensor die is applied onto the protruding structure with an active sensing surface of the sensor die facing the carrier. The sensor die is encapsulated with mold material, wherein the protruding structure prevents the mold material from covering the active sensing surface. The carrier and the protruding structure are removed from the sensor die.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a sensor node module and a method for manufacturing a sensor node module. In one embodiment, the sensor node module is configured as a thin small leadless package (TSLP) module. In one embodiment, the sensor node module includes a semiconductor sensor chip or die that has one or more active sensing surfaces that are to be exposed to an outside environment for sensing one or more parameters, such as temperature, intensity of electromagnetic radiation, pressure of the environment, the presence of cracks or mechanical deformations, or the presence of chemical components, and includes communications circuitry (e.g., a transceiver) for wireless communications and the wireless transmission of sensor data sensed by the active sensing surface.

Figure 1A:
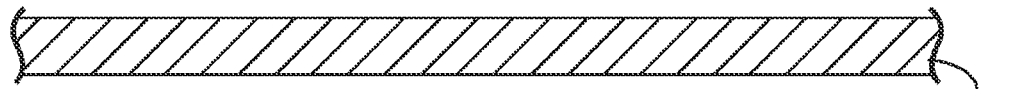
FIGS. 1A-1F are diagrams illustrating a method for manufacturing a sensor node module according to one embodiment.

FIGS. 1A-1F are diagrams illustrating a method for manufacturing a sensor node module according to one embodiment. As shown in FIG. 1A, a carrier 102 is provided. In one embodiment, carrier 102 is a copper sheet having a thickness of, for example, 200 micrometers. With copper, it is possible to grow protruding structures on the carrier by a masked galvanic process. In another embodiment, the carrier 102 is formed from a metal such as aluminum, nickel, steel, CuFe, or an alloy of these metals.

Figure 1B:
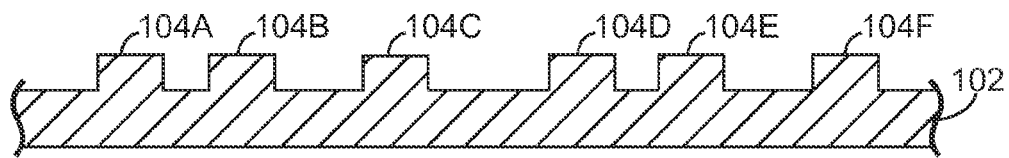

As shown in FIG. 1B, a plurality of protruding structures 104A-104F (collectively referred to as structures 104) are formed in a spaced apart manner on a top surface of the carrier 102. In one embodiment, the structures 104 are formed from the same material as the carrier 102 (e.g., copper). In one embodiment, the structures 104 are formed by a galvanic process (e.g., selective electroplating). This process according to one embodiment includes a photolithographic process to form a mask on the carrier 102 determining the structure of the protruding structures 104 (i.e., a masked galvanic process). The mask according to one embodiment consists of a photo lithographically structured layer of, for example, a photoresist having multiple openings of the same size and shape. Thus, multiple structures 104 of the same size and shape can be grown on the carrier 102 at substantially the same time. In one embodiment, the material used for the galvanic process in forming the protruding structures 104 is one of copper, nickel, zinc, or an alloy such as SnAg. In one embodiment, the structures 104 have a height of between about 30 and 100 micrometers.

Figure 1C:
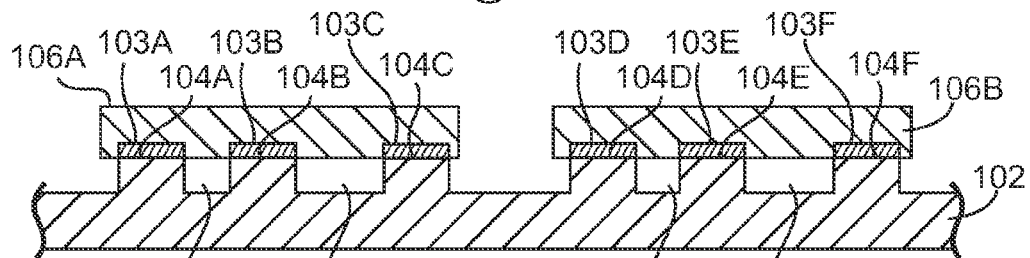

As shown in FIG. 1C, a plurality of sensor dies 106A-106B (collectively referred to as sensor dies 106) are positioned directly on the structures 104. In one embodiment, the sensor dies 106 are each individually placed on a plurality of the structures 104 using a pick and place process, and bonded to the structures 104 using adhesive bonding or soldering. In the illustrated embodiment, the sensor dies 106 include a plurality of active sensing surfaces 103A-103F (collectively referred to as active sensing surfaces 103) that face the carrier 102 and that are aligned with the structures 104. Thus, after positioning of the sensor dies 106 as shown in FIG. 1C, the active sensing surfaces 103 of the dies 106 are covered by the structures 104. Placement of sensor die 106A on structures 104A-104C results in cavities 105A and 105B being formed between the die 106A and the carrier 102. Placement of sensor die 106B on structures 104D-104F results in cavities 105C and 105D being formed between the die 106B and the carrier 102.

Figure 1D:
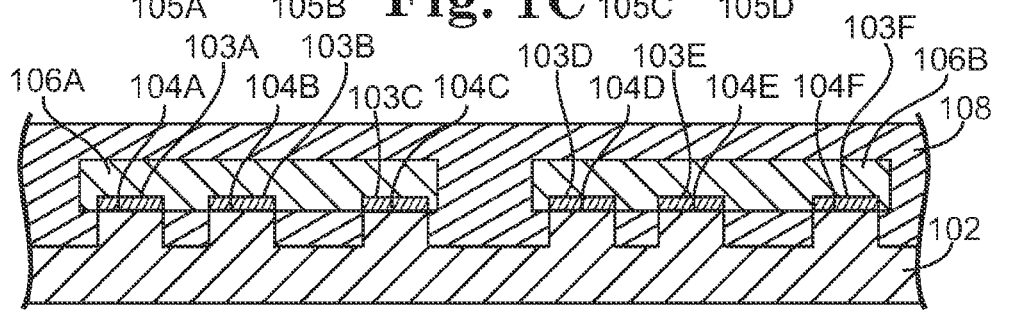

As shown in FIG. 1D, a mold layer 108 is formed on carrier 102 and encapsulates the sensor dies 106A and 106B. In the illustrated embodiment, the mold layer 108 surrounds sensor dies 106A and 106B and fills the cavities 105A-105D. In the illustrated embodiment, the mold layer 108 is disposed on all surfaces of the sensor dies 106 other than the active sensing surfaces 103. In one embodiment, the structures 104A-104F shield the active sensing surfaces 103 of the dies 106 and prevent mold material from covering these surfaces 103. Thus, in one embodiment, the mold material is prevented from covering the active sensing surfaces 103 by application of removable structures (i.e., structures 104) to the active sensing surfaces 103 prior to application of the mold material In one embodiment, the mold layer 108 is formed from a mold material that is dispensable at a high temperature and that turns solid at room temperature or chip operational temperature. This way, by applying the mold material to the sensor dies at a high temperature, uncovered surfaces of the dies become covered so that they are mechanically or chemically protected once the mold material has turned solid. In one embodiment, fluid mold material is poured over the sensor dies 106 until it is evenly distributed over the sensor dies 106 and the carrier 102, and is then made solid due to cooling or drying. In one embodiment, the mold material is an epoxy resin (thermoset) filled with a fill material, such as silicon oxide particles. In one embodiment, the mold material is heated to a temperature of about 170° C. to become sufficiently fluid for pouring.

Figure 1E:
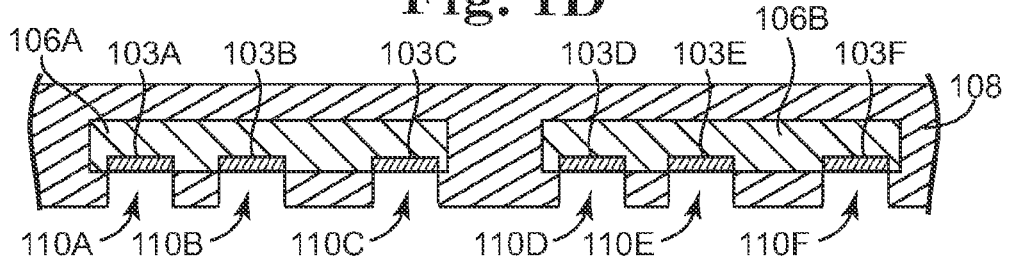

As shown in FIG. 1E, the carrier 102 and the structures 104 are removed from the sensor dies 106, thereby exposing the active sensing surfaces 103 of the sensor dies 106 to the outside environment, while all of the other surfaces of the sensor dies 106 remain encapsulated by the mold layer 108. After the active sensing surfaces 103 are exposed, the sensor dies 106 can measure or detect parameters like pressure, acceleration, temperature, chemical components, etc. In one embodiment, the carrier 102 and the structures 104 are removed by a copper etch process (e.g., using nitric acid). In one embodiment, the active sensing surfaces 103 of the sensor dies 106 are coated with an etch stop material (e.g., a polymer) prior to the attachment of the dies shown in FIG. 1C in order to prevent damage to the surfaces 103 during the removal of the carrier 102 and the structures 104. Removal of the structures 104 results in cavities 110A-110F in the mold layer 108 adjacent to the active sensing surfaces 103 of the sensor dies 106. In one embodiment, the protruding structures 104 are of the same material as the carrier 102, and the protruding structures 104 are removed with the same etching step as the carrier 102 (i.e., both the carrier 102 and the structures 104 are removed with a single etch step).

Figure 1F:
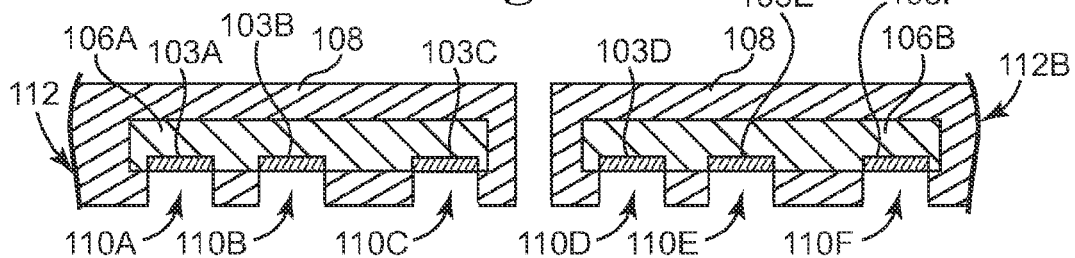

As shown in FIG. 1F, the structure shown in FIG. 1E is singulated during a singulation process, thereby separating the sensor dies 106 into a plurality of separate sensor node modules 112A and 112B. In one embodiment, the sensor node modules 112A and 112B do not include any external electrical contacts, and are configured to communicate wirelessly, such as by wirelessly transmitting sensor information. In the illustrated embodiment, the modules 112A and 112B are completely encapsulated by the mold layer 108, with the exception of the active sensing surfaces 103, which remain open and exposed to the outside environment.

The term "active sensing surface" according to one embodiment refers to regions on a sensor die that can carry out a sensing function, like detecting light, detecting temperature, detecting mechanical forces like pressure or acceleration, detecting magnetic or electrostatic fields, or detecting the presence of chemicals. For example, in one embodiment, the active sensing surface is a region of the sensor die having one or more photon detecting diodes for detecting light. Similarly, in another embodiment, the active sensing surface is a region on the sensor die having conducting lines of temperature dependent resistance for measuring temperature. Also, in other embodiments, the active sensing surface is the region on the sensor die with a mechanical micro-machined lever or membrane for measuring pressure or acceleration (e.g., for a Micro Electro-Mechanical System or MEMS device). Further, in other embodiments for measuring the presence of chemical components, the active sensing surface is a region on the sensor die that provides for specific chemical reaction with the chemical components coming from the environment that are detected by the sensor die.

In one embodiment, the sensor node modules manufactured by the method shown in FIGS. 1A-1F include electronic circuits for driving functional elements (e.g., the active sensing surface), processing signals that are generated by the functional elements, and performing wireless communications (e.g., radio-frequency (RF) or optical communications). Such electronic circuits may be implemented either on the semiconductor chip that includes the functional element, or on one or more separate semiconductor chips integrated into the module. The separate semiconductor chip or chips may be embodied, for example, as an application specific integrated circuit (ASIC). Specific embodiments of different types of single-chip and multiple-chip sensor node modules manufactured by the method shown in FIGS. 1A-1F are described in further detail below with reference to FIGS. 2-5.

Figure 2:
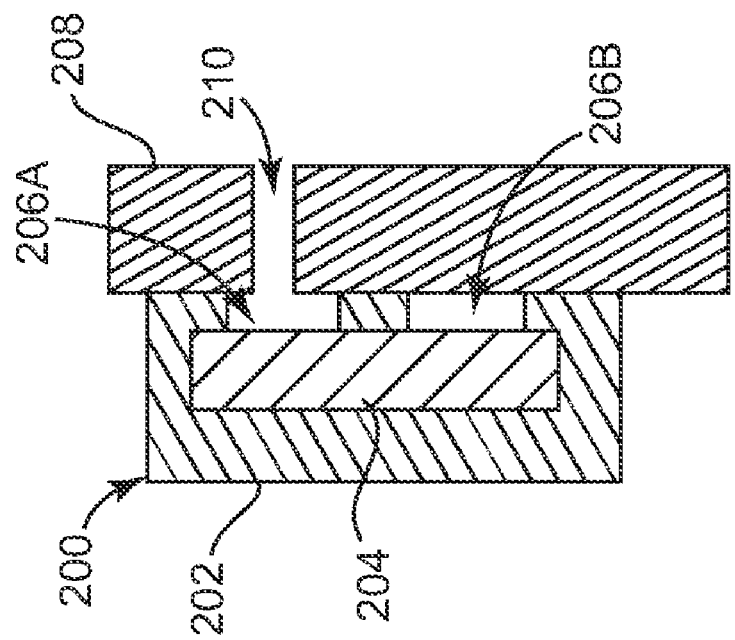
FIG. 2 is a diagram illustrating a sensor node module configured as a pressure sensor according to one embodiment.

FIG. 2 is a diagram illustrating a sensor node module 200 configured as a pressure sensor according to one embodiment. In one embodiment, module 200 is manufactured using the method shown in FIGS. 1A-1F and described above. Module 200 includes mold layer 202, sensor die 204, and cavities 206A and 206B. Mold layer 202 encapsulates sensor die 204. Cavities 206A and 206B are adjacent to the active sensing surfaces of sensor die 204. In the illustrated embodiment, the sensor node module 200 is attached to an interface structure 208, which includes a pressure inlet 210. In one embodiment, an active sensing surface of sensor die 204 is configured to sense pressure through pressure inlet 210 and cavity 206A, and sensor die 204 is configured to wirelessly transmit corresponding pressure data.

Figure 3:
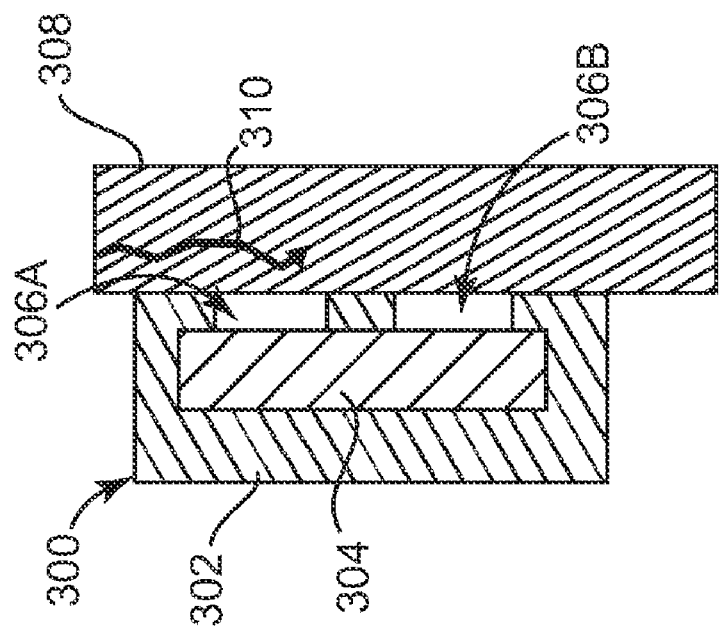
FIG. 3 is a diagram illustrating a sensor node module configured as a crack sensor according to one embodiment.

FIG. 3 is a diagram illustrating a sensor node module 300 configured as a crack sensor according to one embodiment. In one embodiment, module 300 is manufactured using the method shown in FIGS. 1A-1F and described above. Module 300 includes mold layer 302, sensor die 304, and cavities 306A and 306B. Mold layer 302 encapsulates sensor die 304. Cavities 306A and 306B are adjacent to the active sensing surfaces of sensor die 304. In the illustrated embodiment, the sensor node module 300 is attached to an interface structure 308, which includes a crack 310. In one embodiment, one or more active sensing surfaces of sensor die 204 are configured to sense or detect cracks or mechanical deformations in structure 308, and sensor die 304 is configured to wirelessly transmit corresponding crack detection data.

Figure 4:
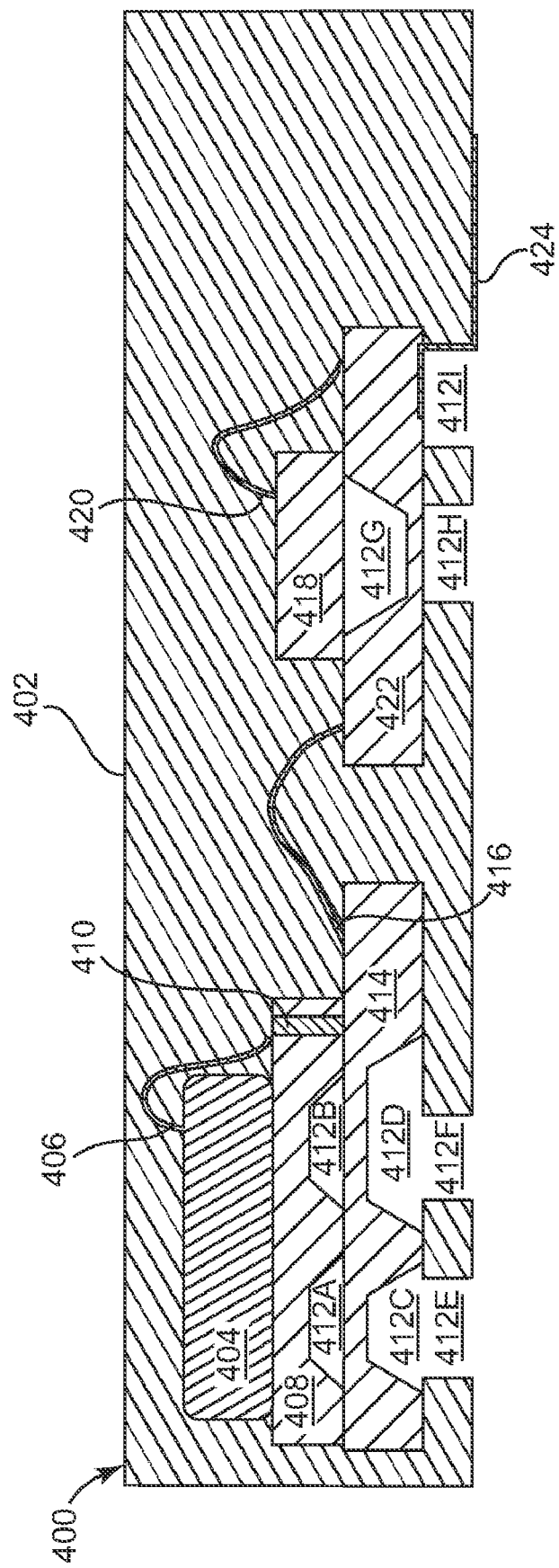
FIG. 4 is a diagram illustrating a multi-chip sensor node module according to one embodiment.

Sensor node modules according to some embodiments may be implemented with a single chip or multiple chips. FIGS. 2 and 3 show examples of single-chip sensor node modules according to one embodiment. FIG. 4 is a diagram illustrating a multi-chip sensor node module 400 according to one embodiment. In one embodiment, module 400 is manufactured using the method shown in FIGS. 1A-1F and described above. Module 400 includes mold layer 402, battery 404, bond wires 406, 416, and 420, conductive through-via 410, semiconductor chips 408, 414, 418, and 422, and cavities 412A-412J. Mold layer 402 encapsulates semiconductor chips 408, 414, 418, and 422. Battery 404 is stacked on chip 408. Chip 408 is stacked on chip 414, and chip 418 is stacked on chip 422. The chip stack that includes chips 408 and 414 is positioned in a side-by-side manner in module 400 with the chip stack that includes chips 418 and 422. Battery 404 is electrically coupled to chip 408 through bond wire 406. Chip 408 is electrically coupled to chip 414 through the conductive through-via 410. Chip 414 is electrically coupled to chip 422 through bond wire 416. Chip 418 is electrically coupled to chip 422 through bond wire 420. Thus, in the illustrated embodiment, all of the chips are electrically interconnected to each other and to battery 404. Cavities 412A and 412B are formed in chip 408. Cavities 412C and 412D are formed in chip 414. Cavity 412G is formed in chip 422. Cavities 412E, 412F, 412H, and 412I are formed in mold layer 402. An antenna (not shown) may also be integrated into the module 400, or may be plated onto the mold layer 402 with an interconnect to the interior of the module 400.

Figure 5:
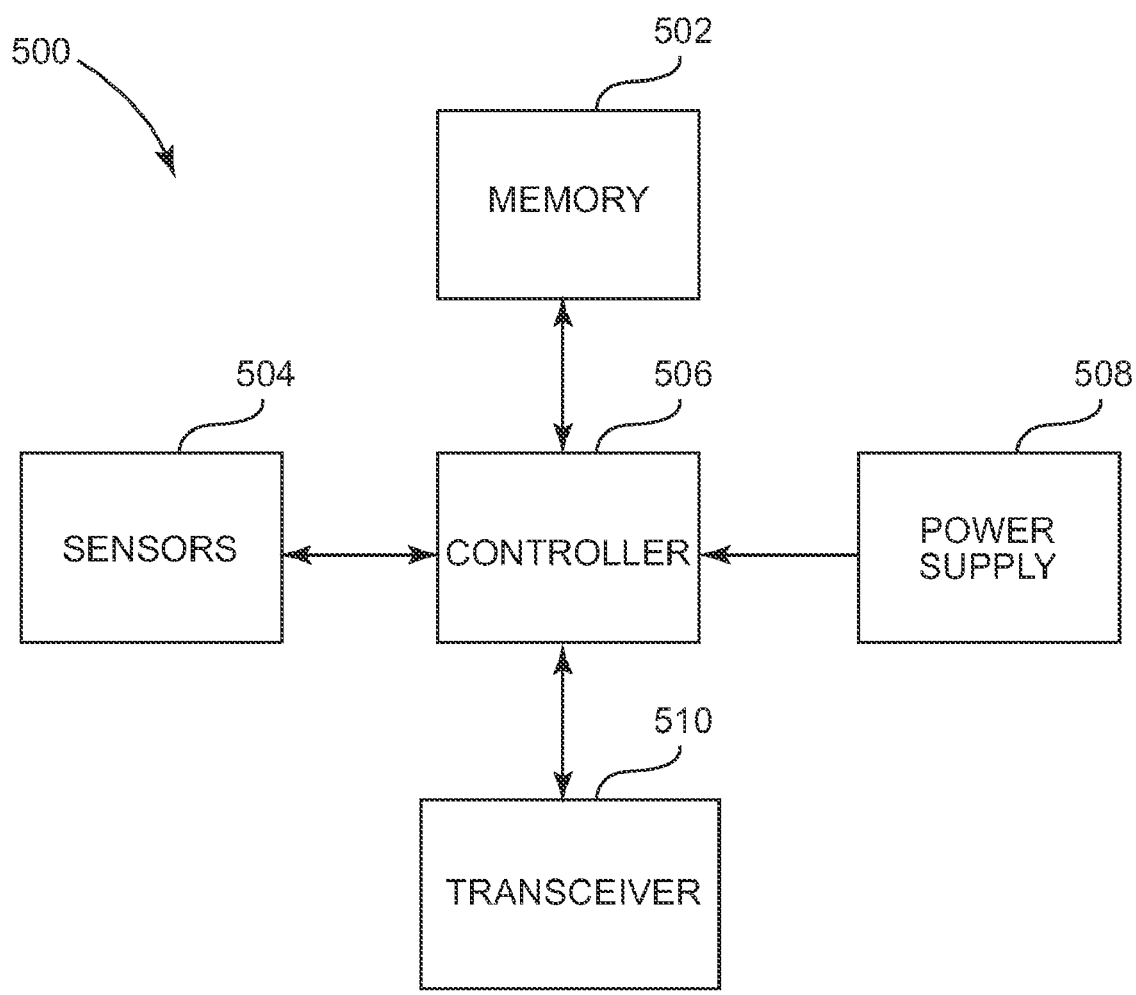
FIG. 5 is a block diagram illustrating components of a sensor node module according to one embodiment.

FIG. 5 is a block diagram illustrating components of a sensor node module 500 according to one embodiment. In one embodiment, the sensor node modules 112A and 112B (FIG. 1F), sensor node module 200 (FIG. 2), sensor node module 300 (FIG. 3), and sensor node module 400 (FIG. 4), each include the components illustrated in FIG. 5. As shown in FIG. 5, sensor node module 500 includes memory 502, one or more sensors 504, controller 506, power supply (e.g., a battery) 508, and transceiver 510. Power supply 508 provides power to the components of module 500. The one or more sensors 504 sense signals and provide corresponding sensor data to controller 506. Controller 506 stores sensor data and other data in memory 502. Controller 506 also causes sensor data to be wirelessly transmitted from module 500 via transceiver 510. Controller 506 is also configured to wirelessly receive data through transceiver 510.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a sensor node module, comprising:
    forming a protruding structure on a carrier;
    applying a sensor die onto the protruding structure formed on the carrier in a manner that results in no cavity between an active sensing surface of the sensor die and the protruding structure formed on the carrier;
    encapsulating the sensor die with mold material, wherein the protruding structure prevents the mold material from covering the active sensing surface; and
    removing the carrier and the protruding structure from the sensor die.

2. The method of claim 1, wherein the protruding structure is formed of the same material as the carrier.

3. The method of claim 2, wherein the protruding structure and the carrier are both formed of copper.

4. The method of claim 1, wherein the protruding structure is formed with a galvanic process.

5. The method of claim 1, wherein the protruding structure is formed by electroplating.

6. The method of claim 1, wherein the carrier and the protruding structure are removed by etching.

7. The method of claim 6, wherein the carrier and the protruding structure are removed in a single etching step.

8. The method of claim 1, wherein the removal of the carrier and the protruding structure results in a cavity in the mold material adjacent to the active sensing surface.

9. The method of claim 1, wherein the sensor node module includes no external electrical contacts.

10. The method of claim 1, wherein the sensor node module includes communications circuitry for wirelessly transmitting sensor data.

11. The method of claim 1, wherein the sensor node module includes a power supply.

12. The method of claim 11, wherein the power supply is a battery.

13. The method of claim 1, wherein the sensor node module includes a plurality of semiconductor chips.

14. The method of claim 1, wherein the protruding structure allows the mold material to cover all surfaces of the sensor die except the active sensing surface.

15. A method of manufacturing sensor node modules, comprising:
    forming a plurality of protruding structures on a carrier;
    applying a plurality of sensor dies onto the protruding structures formed on the carrier in a manner that results in no cavity between an active sensing surface of each sensor die and a corresponding one of the protruding structures formed on the carrier;
    encapsulating the sensor dies with a mold material, wherein the protruding structures prevent the mold material from covering the active sensing surface of the sensor dies;
    removing the carrier and the protruding structures from the sensor dies; and
    performing a singulation process to separate the sensor dies into separate sensor node modules.

16. The method of claim 15, wherein the protruding structures are formed of the same material as the carrier.

17. The method of claim 15, wherein the protruding structures are formed with a galvanic process.

18. The method of claim 15, wherein the carrier and the protruding structures are removed in a single etching step.

19. The method of claim 15, wherein the sensor node module includes a power supply and communications circuitry for wirelessly transmitting sensor data.

20. The method of claim 15, wherein the protruding structures allow the mold material to cover all surfaces of the sensor dies except the active sensing surfaces.

* * * * *